United States Patent [19]

Ikegame

[11] Patent Number: 5,045,924
[45] Date of Patent: Sep. 3, 1991

[54] MOUNTING STRUCTURE OF SEMICONDUCTOR CONVERTER

[75] Inventor: Hiroo Ikegame, Tokyo, Japan

[73] Assignee: Kabushiki Kaisha Toshiba, Kawasaki, Japan

[21] Appl. No.: 492,402

[22] Filed: Mar. 8, 1990

Related U.S. Application Data

[63] Continuation of Ser. No. 161,045, Feb. 26, 1988, abandoned.

[51] Int. Cl.⁵ .................. H01L 23/02; H01L 23/12
[52] U.S. Cl. .......................... 357/81; 357/74; 361/386
[58] Field of Search ............... 363/141; 361/383, 386, 361/388; 357/72, 74, 81

[56] References Cited

U.S. PATENT DOCUMENTS 4,563,383  1/1986  Kuneman ............... 428/216
4,600,968  7/1986  Sekiya ................... 361/394

Primary Examiner—Jerome Jackson, Jr.
Assistant Examiner—Stephen D. Meier
Attorney, Agent, or Firm—Foley & Lardner

[57] ABSTRACT

A mounting structure of a semiconductor converter comprising a frame and circuit components including a first group of circuit components which almost need not a cooling except for a semiconductor element, and a second group of circuit components which requires a cooling, in which the first group of circuit components such as a gate turnoff element, a thyristor, a snubber capacitor, a snubber diode, a gate circuit, a by-pass diode, a fuse and a heat sink is arranged in units on a front side of the frame, and the second group of circuit components such as a snubber resistor and an anode reactor is arranged within the frame behind the units.

4 Claims, 3 Drawing Sheets

MOUNTING STRUCTURE OF SEMICONDUCTOR CONVERTER

This application is a continuation, of application Ser. No. 07/161,045, filed Feb. 26, 1988 now aband.

BACKGROUND OF THE INVENTION

1. Field of the Invention

The present invention relates to a mounting structure of a semiconductor converter including a semiconductor element such as a gate turnoff element thyristor.

2. Description of the Prior Art

Recently, a semiconductor converter including a semiconductor element such as a gate turnoff thyristor has been used in a variety of fields and its capacity has been enlarged. Thus, not only a compact and efficient mounting way of parts of the semiconductor converter but also a simple maintenance and inspection way of the semiconductor converter have been sought. The mounting of the components of the semiconductor converter should be carried out in careful consideration of a mounting workability of the components, the most suitable arrangement of the components with regard to the individual natures and efficiency thereof, and a readiness or simplicity of the maintenance and the inspection of the semiconductor converter.

In FIG. 1, there is shown a main circuit of a conventional semiconductor converter including gate turnoff elements 1, and each gate turnoff element 1 represents a gate turnoff circuit unit in fact, as hereinafter described in detail. In the drawing, a direct current is input to lines 2 and 3 and alternating currents are output from lines 4, 5 and 6. In FIG. 2, there is shown a gate turnoff circuit unit comprising the gate turnoff element 1, a snubber diode 7, a snubber capacitor 8, a snubber resistor 9, an anode reactor 10 for restraining a rise of the current during a commutation, a fuse 11 for protecting the gate turnoff element 1 from an overcurrent, a diode 12 for by-passing a current coming to the gate turnoff element 1 from another circuit unit, and a gate circuit 13 for controlling an ON and an OFF of the gate turnoff element 1.

In this case, a conventional mounting structure of the semiconductor converter is shown in FIG. 3, and the circuit components such as the gate turnoff element 1, a heat sink 15 for cooling the gate turnoff element 1 and so forth are mounted in one unit form. For instance, as shown in FIG. 4, the circuit components shown in FIG. 2 are mounted within a drawer tray 14 and the trays 14 are contained within a frame 16 of the semiconductor converter.

In this embodiment, when a trouble arises in any of the circuit components within the tray 14, the entire tray 14 is drawn out in order to repair the trouble. Further, when a periodical maintenance and inspection of the semiconductor converter is carried out, the tray 14 is firstly drawn out, which is rather inconvenient. Further, when the fuse 11 is blown down or the gate turnoff element 1 is broken down, the tray 14 is drawn out and the tray 14 as a whole is necessarily replaced by another one. On this occasion, a particular tool such as a lifter is also required. In this case, of course, spare components are stocked every tray unit, which is also inconvenient and uneconomical.

SUMMARY OF THE INVENTION

Accordingly, it is an object of the present invention to provide a mounting structure of a semiconductor converter, free from the aforementioned inconveniences and defects of the prior art, which is capable of improving a mounting efficiency and a readiness or simplicity of a maintenance and an inspection of the semiconductor converter, and which is economical.

In accordance with one aspect of the present invention, there is provided a mounting structure of a semiconductor converter comprising a frame and circuit components which comprise a first group of circuit components almost not requiring a cooling and a second group of circuit components requiring a cooling, the first group of circuit components being arranged in units on a front side of the frame, the second group of circuit components being arranged within the frame behind the units.

BRIEF DESCRIPTION OF THE DRAWINGS

The above and other objects, features and advantages of the present invention will be more fully appear from the following description of the preferred embodiment with reference to the accompanying drawings, wherein like reference characters designate like or corresponding parts throughout several views, in which.

DESCRIPTION OF THE PREFERRED EMBODIMENT

Figure 5:
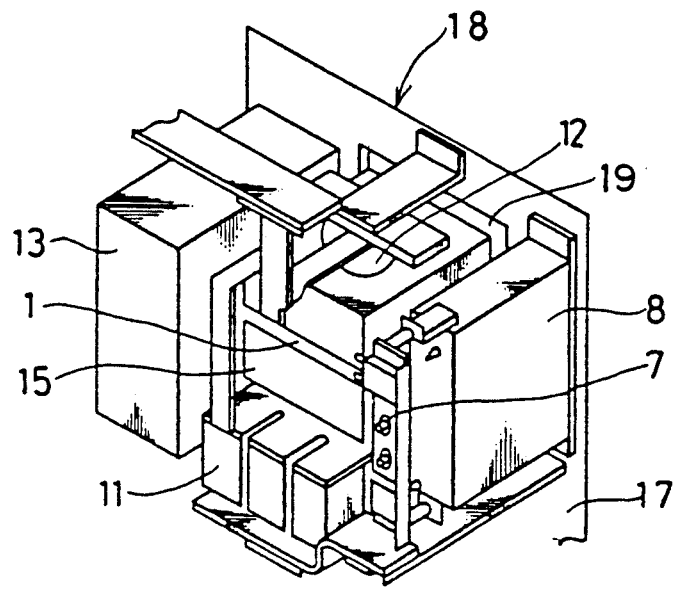
FIG. 5 is a perspective view of a mounting structure of a semiconductor converter unit according to the present invention.
Figure 6:
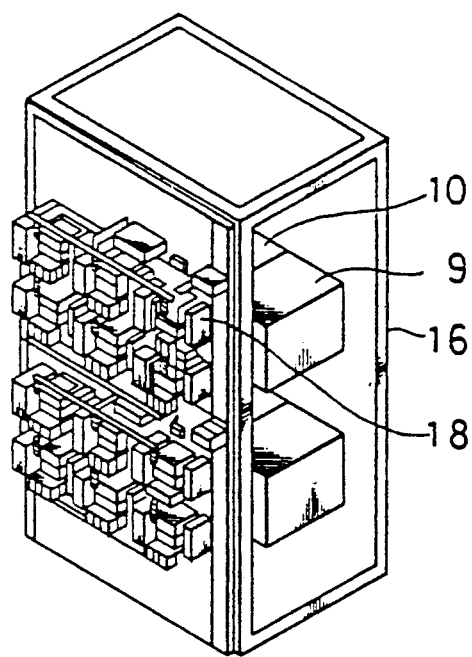
FIG. 6 is a perspective view of a mounting structure of a semiconductor converter including units of FIG. 5 according to the present invention.

Referring now to the drawings, there is shown in FIGS. 5 and 6 a mounting structure of a semiconductor converter including a semiconductor element such as a gate turnoff thyristor according to the present invention.

Figure 1:
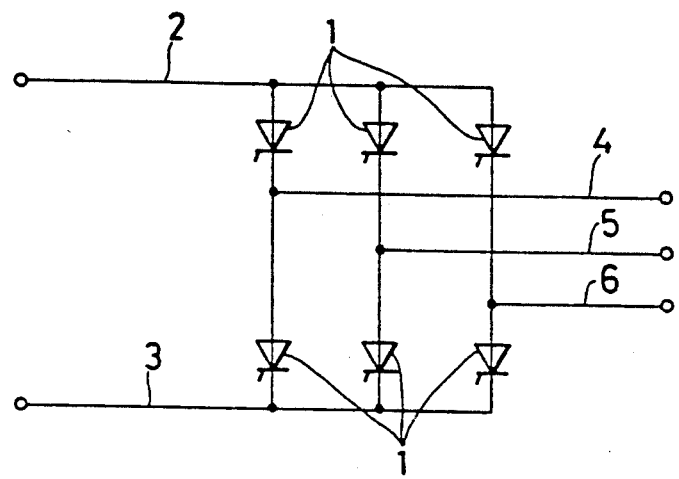
FIG. 1 is a circuit diagram of a conventional semiconductor converter.
Figure 2:
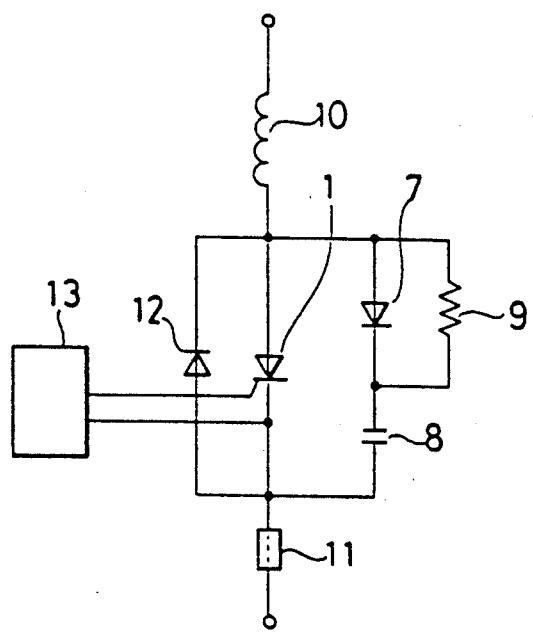
FIG. 2 is a circuit diagram of a gate turnoff circuit unit of FIG. 1.
Figure 3:
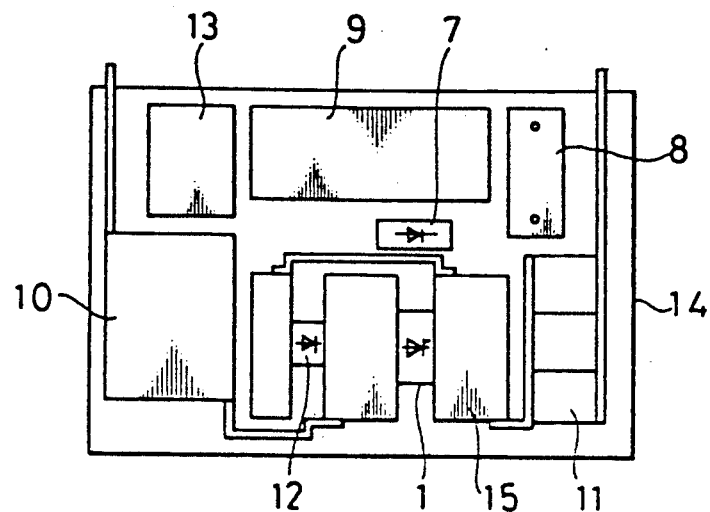
FIG. 3 is a top plan view of a conventional tray containing circuit components mounted therein.
Figure 4:
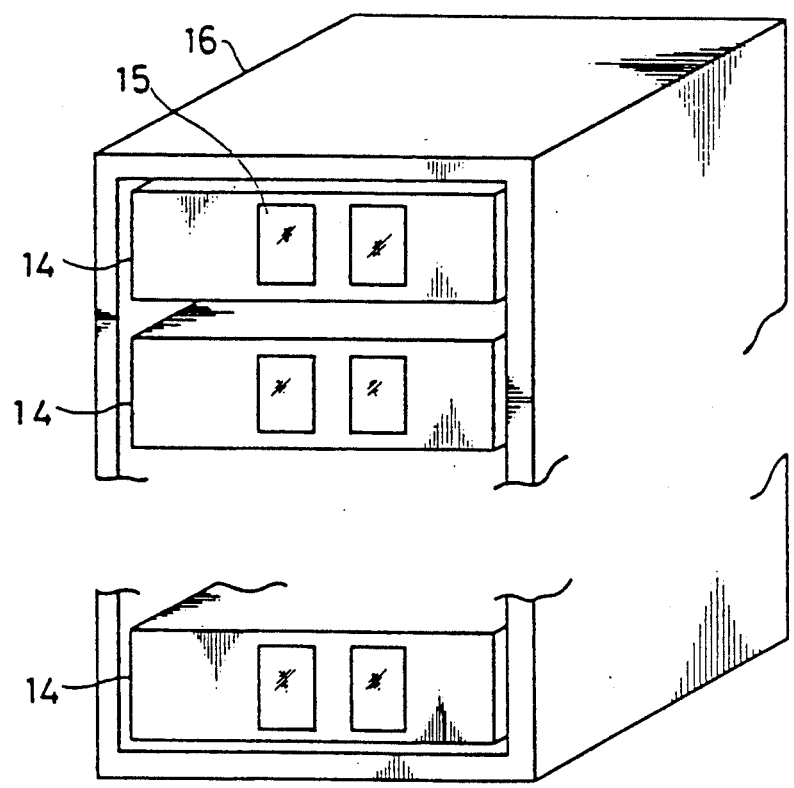
FIG. 4 is a perspective view, partly omitted, of a conventional semiconductor converter including trays of FIG. 3 within a frame.

In this embodiment, circuit components are electrically connected in the similar manner to those shown in FIG. 2. In the drawings, a semiconductor element such as a gate turnoff element or thyristor 1, a snubber diode 7, a snubber capacitor 8, a by-pass diode 12, a gate circuit 13, a fuse 11 and a heat sink 15 are mounted to an insulating plate 17 having cooling air receiving hole 19 to obtain a semiconductor converter unit 18, as shown in FIG. 5, and these circuit components almost needs no cooling except for the semiconductor element. It is necessary to connect these circuit components with the semiconductor switching element at the shortest distances. Then, thus the obtained semiconductor converter units 18 are vertically arranged on a front side of a frame 16 of the semiconductor converter. The other circuit components which are large-sized and necessitate a cooling, such as a snubber resistor 9 and an anode reactor 10 are mounted within the frame 16 behind the unit 18.

It is readily understood from the above description of the preferred embodiment of the present invention that, since the circuit components which particularly requires the maintenance and the inspection but requires almost no cooling, are all arranged on the front side of the semiconductor converter, it is possible to inspect or to replace only the requested component without demounting the semiconductor converter unit, and hence the maintenance and inspection operation can be conducted quickly in a quite simple manner. Further, since the large-sized circuit components which necessitates cooling but almost no maintenance and inspection, are arranged in the rear portion of the semiconductor converter, the entire space of the semiconductor converter can be effectively utilized. Further, in this embodiment, the spare circuit components can be all stocked in component pieces, and a particular tool such as a lifter is not required when the maintenance and the inspection are carried out.

It is readily understood that according to the present invention, the efficiency of the mounting structure of the semiconductor converter can be largely improved, and the maintenance and the inspection of the semiconductor converter can be readily and economically conducted.

Although the present invention has been described in its preferred embodiment with reference to the accompanying drawings, it is readily understood that the present invention is not restricted to the preferred embodiment and that the various changes and modifications of the present invention may be made by a person skilled in the art without departing from the spirit and scope of the present invention.

What is claimed is:

1. A mounting structure of a semiconductor converter comprising a frame and individual circuit components, each circuit component being separately packaged from other circuit components to be individually accessible, the circuit components being arranged on the frame in first and second groups, the second group of circuit components being of a larger size than circuit components in the first group and requiring a first degree of cooling, the first group of circuit components being smaller than the circuit components of the second group and requiring a second degree of cooling, the second degree of cooling being substantially less than the first degree of cooling, the first group of circuit components including a semiconductor element and other circuit components requiring a maintenance and a short distance connection with the semiconductor element, the individual circuit components of the first group being arranged in units exclusively, on a front side of the frame, the second group of circuit components being arranged exclusively within the frame behind the units.

2. The structure recited in claim 1, wherein the first group of circuit components is mounted onto an insulating plate per unit, the insulating plate having a hole for passing cooling air first over the semiconductor element and fuse, the cooling air subsequently passing over the second group of circuit components.

3. The structure recited in claim 2, wherein the units are vertically arranged on the front side of the frame such that the first group of circuit components is accessed simultaneously.

4. A mounting structure of a semiconductor converter comprising a frame and circuit components which include first and second groups of circuit components mounted on the frame, the second group of circuit components requiring cooling, the first group of circuit components including a semiconductor element and other circuit components requiring a maintenance and a short distance connection with the semiconductor element, the first group of circuit components requiring less cooling than the second group of circuit components, the first group of circuit components being arranged in units exclusively on a front side of the frame, the second group of circuit components being arranged exclusively within the frame behind the units and wherein the semiconductor element of the first group comprises one of a gate turnoff element and a thyristor, the first group further comprises a snubber capacitor, a snubber diode, a gate circuit, a by-pass diode, a fuse and a heat sink, and wherein the second group of circuit components comprises a snubber resistor and an anode reactor.

* * * * *